(12) United States Patent
Park et al.

(10) Patent No.: US 7,649,311 B2
(45) Date of Patent: Jan. 19, 2010

(54) ORGANIC ELECTROLUMINESCENT DISPLAY DEVICE AND METHOD OF FABRICATING THE SAME

(75) Inventors: Jao-Yong Park, Gyeonggi-do (KR); Nam-Yang Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 88 days.

(21) Appl. No.: 10/878,512

(22) Filed: Jun. 29, 2004

(65) Prior Publication Data

US 2005/0140282 A1 Jun. 30, 2005

(30) Foreign Application Priority Data

Dec. 30, 2003 (KR) .................. 10-2003-0100603

(51) Int. Cl.
*H01J 63/04* (2006.01)
*H01J 1/62* (2006.01)

(52) U.S. Cl. ............... 313/505; 313/483; 313/498; 313/504; 313/506; 313/503; 428/690; 428/917; 445/24; 445/25; 257/E31.095

(58) Field of Classification Search ............. 313/505
See application file for complete search history.

(56) References Cited

U.S. PATENT DOCUMENTS

| | | | | |
|---|---|---|---|---|
| 5,909,081 | A * | 6/1999 | Eida et al. ............ | 313/504 |
| 6,137,221 | A * | 10/2000 | Roitman et al. ........ | 313/504 |
| 6,175,345 | B1 | 1/2001 | Kuribayashi et al. .... | 313/506 |
| 6,548,961 | B2 | 4/2003 | Barth et al. .......... | 313/506 |
| 6,798,132 | B2 * | 9/2004 | Satake ............... | 313/495 |
| 6,844,673 | B1 * | 1/2005 | Bernkopf ............. | 313/505 |
| 6,870,186 | B2 * | 3/2005 | Park et al. ........... | 257/59 |
| 6,870,197 | B2 * | 3/2005 | Park et al. ........... | 257/98 |
| 6,927,536 | B2 * | 8/2005 | Kim et al. ............ | 313/504 |
| 6,933,574 | B2 * | 8/2005 | Park et al. ........... | 257/359 |
| 6,984,847 | B2 * | 1/2006 | Park et al. ........... | 257/40 |
| 7,012,366 | B2 * | 3/2006 | Park et al. ........... | 313/505 |
| 2002/0158577 | A1 | 10/2002 | Shimoda et al. ....... | 313/506 |
| 2003/0111954 | A1 * | 6/2003 | Koo et al. ........... | 313/498 |
| 2003/0201445 | A1 | 10/2003 | Park et al. ........... | 257/79 |

FOREIGN PATENT DOCUMENTS

| | | |
|---|---|---|
| CN | 1454030 A | 11/2003 |
| JP | 2001-177509 | 4/2001 |

(Continued)

*Primary Examiner*—Nimeshkumar D. Patel
*Assistant Examiner*—Natalie K Walford
(74) *Attorney, Agent, or Firm*—Morgan, Lewis & Bockius LLP (57) ABSTRACT

An organic electroluminescent display device includes first and second substrates facing and spaced apart from each other, gate and data lines on an inner surface of the first substrate and crossing each other to define a pixel region, a switching element at a crossing point of the gate and data lines, a driving element connected to the switching element, a first electrode on an inner surface of the second substrate, an organic light-emitting layer on the first electrode in the pixel region, a second electrode on the organic light-emitting layer in the pixel region and electrically connected to the driving element, and a coloring element on an outer surface of the second substrate in the pixel region.

22 Claims, 9 Drawing Sheets

FOREIGN PATENT DOCUMENTS

| | | |
|---|---|---|
| KR | 2002-0047889 | 6/2002 |
| KR | 2003-0013700 | 2/2003 |
| KR | 2003-0086167 | 11/2003 |
| KR | 2004-0079476 | 9/2004 |
| WO | WO-02/078101 | 10/2002 |
| WO | WO 03050893 A1 * | 6/2003 |

* cited by examiner

ORGANIC ELECTROLUMINESCENT DISPLAY DEVICE AND METHOD OF FABRICATING THE SAME

The present invention claims the benefit of Korean Patent Application No. 2003-0100603 filed in Korea on Dec. 30, 2003, which is hereby incorporated by reference.

BACKGROUND OF THE INVENTION

1. Field of the Invention

The present invention relates to an electroluminescent display device, and more particularly, to an organic electroluminescent display device and a method of fabricating the same.

2. Discussion of the Related Art

In general, an organic electroluminescent display device emits light by injecting electrons from a cathode electrode and holes from an anode electrode into an emissive layer, combining the electrons and the holes to generate an exciton, and by transiting the exciton from an excited state to a ground state. Since the organic electroluminescent display device does not require an additional light source due to its self-luminescence property, the organic electroluminescent display device has a small size and is light weight, as compared to a liquid crystal display device. The organic electroluminescent display device also has a low power consumption, high brightness, and a short response time. Thus, the organic electroluminescent display device is used in many consumer electronic applications, such as cellular phones, car navigation systems (CNSs), personal digital assistants (PDAs), camcorders, and palm PCs. In addition, the organic electroluminescent display device can have reduced manufacturing costs because of its simple manufacturing processes.

Organic electroluminescent display devices may be categorized into passive matrix-type and active matrix-type depending upon the method used to drive the device. Passive matrix-type organic electroluminescent display devices have a simple structure and are fabricated through a simple manufacturing process. However, the passive matrix-type organic electroluminescent display devices have a high power consumption, thereby preventing use in large area displays. Furthermore, in passive matrix organic electroluminescent display devices, the aperture ratio decreases due to the increased number of electrical lines. Thus, the passive matrix-type organic electroluminescent display devices are commonly used as small-sized display devices. Active matrix-type organic electroluminescent display (AMOELD) devices are commonly used as large-sized display devices since they have a high luminous efficacy, and provide high definition images.

Figure 1:
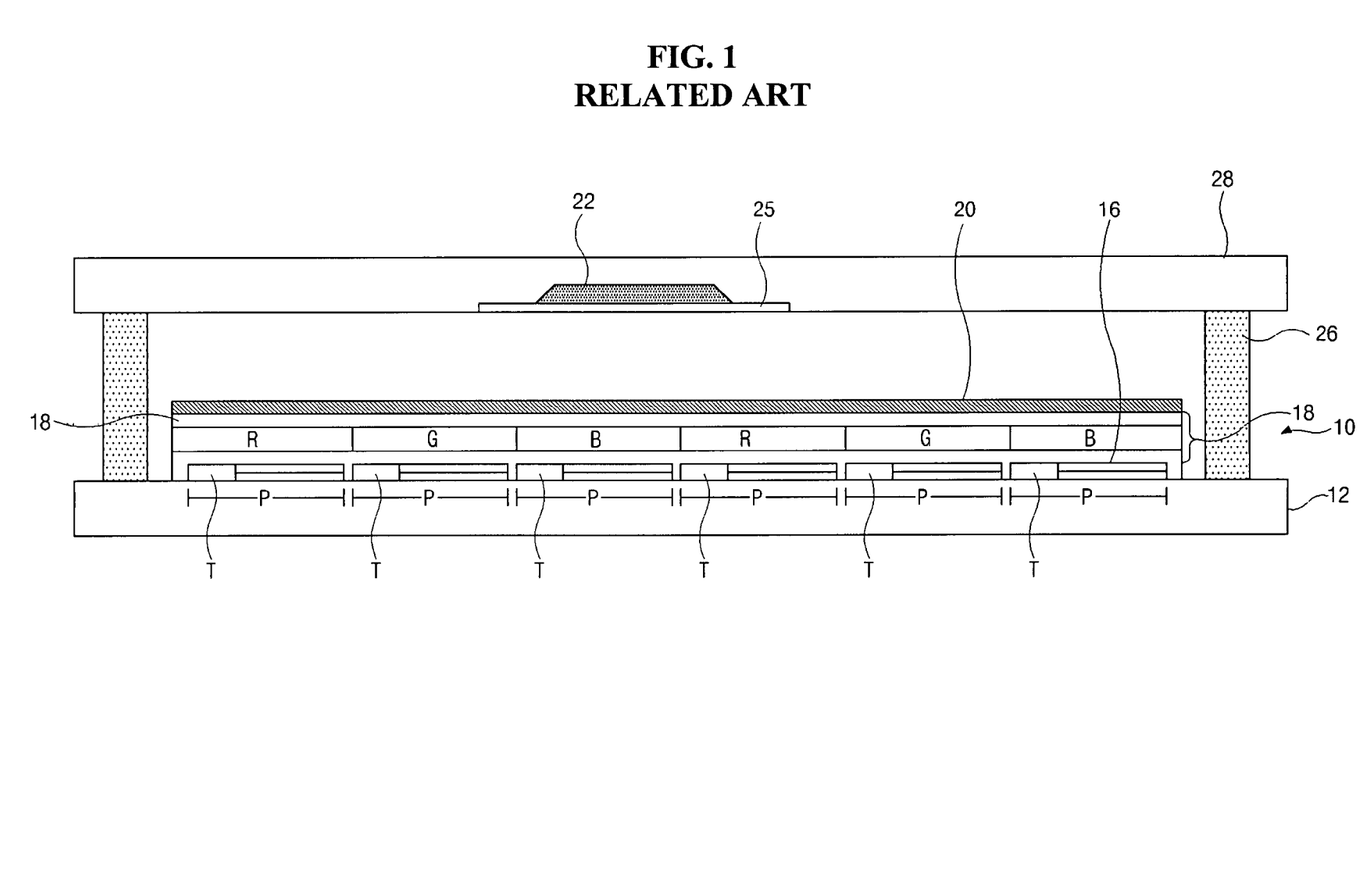
FIG. 1 is a cross sectional view of an active matrix-type organic electro-luminescent display device according to the related art.

FIG. 1 is a cross sectional view of an active matrix-type organic electro-luminescent display (AMOELD) device according to the related art. In FIG. 1, the AMOELD device 10 includes a first substrate 12 and a second substrate 28, which are spaced apart and face each other. The first substrate 12 is transparent and flexible. A plurality of thin film transistors T and a plurality of first electrodes 16 are formed on an inner surface of the first substrate 12, in which each of first electrodes 16 are connected to the respective thin film transistor T. Organic layers 18 are formed on the first electrodes 16 and the thin film transistors T, and a second electrode 20 is formed on the organic layers 18. The organic layers 18 emit light of three colors: red (R), green (G), and blue (B) within a pixel region P, and are generally formed by patterning an organic material that emits one of red, green and blue.

A desiccant 22 is formed on an inner surface of the second substrate 28 to remove any external moisture and air that may permeate into a space between the first and second substrates 12 and 28. The inner surface of the second substrate 28 is patterned to form a groove, and the desiccant 22 is disposed within the groove and is fastened with a tape 25.

A sealant 26 is formed between the first and second substrates 12 and 28 to attach the first and second substrates 12 and 28, and surrounds elements, such as the thin film transistors T, the first electrodes 16, the organic layers 18, and the second electrodes 20. The sealant 26 forms an airtight space to protect the elements from the external moisture and air.

In the above OELD device, the first electrode 16 functions as an anode electrode and is transparent. Thus, this AMOELD device has a bottom emission type, in which light is emitted through the first electrode 16.

Figure 2:
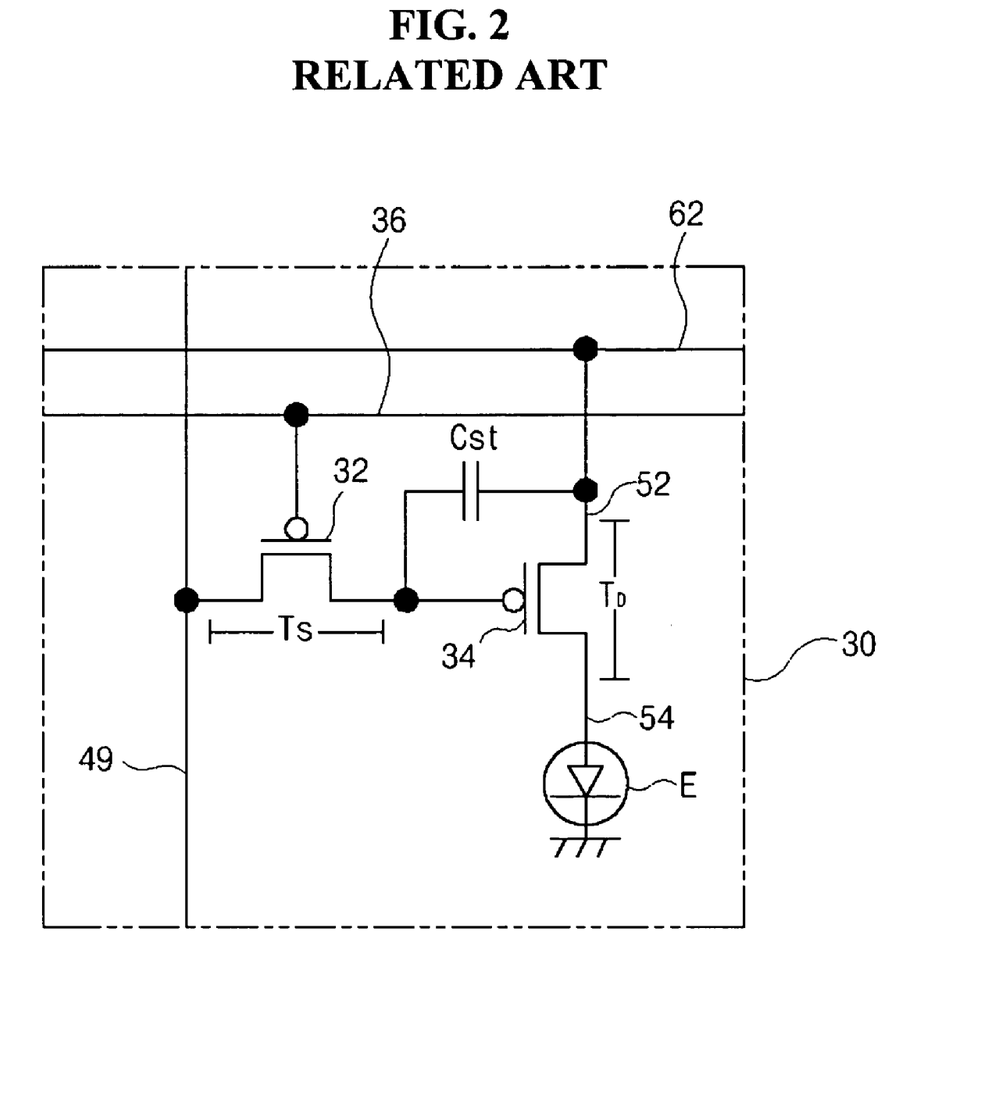
FIG. 2 is an equivalent circuit for a pixel of an organic electroluminescent display device according to the related art.

FIG. 2 is an equivalent circuit for a pixel of an organic electroluminescent display (OELD) device according to the related art.

As shown in FIG. 2, a gate line 36 is formed along one direction of a substrate 30 and a data line 49 perpendicularly crosses the gate line 36. A switching element $T_S$ is formed at a crossing point of the gate line 36 and the data line 49, and a driving element $T_D$ is electrically connected to the switching element $T_S$.

Since the driving element $T_D$ is a p-type thin film transistor, a storage capacitor $C_{ST}$ is disposed between a source electrode 52 of the driving element $T_D$ and a gate electrode 34 of the driving element $T_D$, and a drain electrode 54 of the driving element $T_D$ is connected to an anode electrode of an organic electroluminescent diode E, which corresponds to a first electrode 16 of FIG. 1. The source electrode 52 of the driving element $T_D$ is also connected to a power line 62.

The OELD device having the above structure can be driven as follows.

First, when a gate signal is applied to a gate electrode 32 of the switching element $T_S$, a current signal flowing through the data line 49 is changed into a voltage signal through the switching element $T_S$ and is applied to the gate electrode 34 of the driving element $T_D$. Then, the driving element $T_D$ turns on, and thus the gray scale is realized by determining levels of the current flowing through the organic electroluminescent diode E.

At this time, because signals stored in the storage capacitor $C_{ST}$ maintain the signal of the gate electrode 34 of the driving element $T_D$, the level of the currents flowing through the organic electroluminescent diode E is kept constant until a next signal is applied even if the switching element $T_S$ turns off. The switching element $T_S$ and the driving element $T_D$ may be an amorphous silicon thin film transistor or a polycrystalline silicon thin film transistor. The amorphous silicon thin film transistor is more simply manufactured as compared with the polycrystalline silicon thin film transistor.

The above OELD device is manufactured by attaching a substrate having array elements and organic luminescent diodes with another substrate for encapsulation. Since the yield of the OELD device depends on the yields of the thin film transistor and the organic light-emitting layer, the whole processing yield is largely affected by processes for forming the organic light-emitting layer that occur at a later stage. Thus, even if the array elements are properly well formed, if the organic light-emitting layer to be formed to a thickness of about 1,000 Å is improperly formed due to impurities or other factors, the resulting OELD device is rejected as bad. Accordingly, the yield of the OELD device is reduced because of the impurities and other factors in the organic light-emitting forming processes, thereby resulting in a loss of manufacturing costs and source materials for the thin film transistor.

The bottom emission mode OELD device has a good stability and a certain degree of freedom in its manufacturing processes. However, the bottom emission mode OELD device has a reduced aperture ratio. Thus, the bottom emission mode OELD device is not suited for a high aperture device.

On the other hand, a top emission mode OELD device has a high aperture ratio, and is easy to manufacture. Additionally, the top emission mode OELD device has a long lifetime. However, in the top emission mode OELD device, since a cathode electrode is generally disposed over the organic light-emitting layer, a choice of material with which to make the cathode electrode is limited. Accordingly, the transmittance of light is limited, and a light-emitting efficacy is reduced. Furthermore, in order to improve the light transmittance, the passivation layer should be formed as a thin film, whereby the exterior moisture and air are not fully blocked.

SUMMARY OF THE INVENTION

Accordingly, the present invention is directed to an organic electroluminescent display device and a method of fabricating the same that substantially obviate one or more of the problems due to limitations and disadvantages of the related art.

An object of the present invention is to provide an organic electroluminescent display device and a method of fabricating the same having a high aperture ratio and displaying high definition images.

Another object of the present invention is to provide an organic electroluminescent display device and a method of fabricating the same having an improved yield and productivity.

Another object of the present invention is to provide an organic electroluminescent display device and a method of fabricating the same that are reliable.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes first and second substrates facing and spaced apart from each other, gate and data lines on an inner surface of the first substrate and crossing each other to define a pixel region, a switching element at a crossing point of the gate and data lines, a driving element connected to the switching element, a first electrode on an inner surface of the second substrate, an organic light-emitting layer on the first electrode in the pixel region, a second electrode on the organic light-emitting layer in the pixel region and electrically connected to the driving element, and a coloring element on an outer surface of the second substrate in the pixel region.

In another aspect, a method of fabricating an organic electroluminescent display device includes forming gate and data lines on a first substrate, the gate and data lines crossing each other to define a pixel region, forming a switching element at a crossing point of the gate and data lines, forming a driving element connected to the switching element, forming a first electrode on a first surface of a second substrate, forming an organic light-emitting layer on the first electrode, forming a second electrode on the organic light-emitting layer, forming a coloring element on a second surface of the second substrate, attaching the first substrate and the second substrate including the coloring element such that the second electrode faces and is electrically connected to the driving element.

In another aspect, an organic electroluminescent display device includes first and second substrates facing and spaced apart from each other, gate and data lines on an inner surface of the first substrate and crossing each other to define a pixel region, a switching element at a crossing point of the gate and data lines, a driving element connected to the switching element, a first electrode on an inner surface of the second substrate, an organic light-emitting layer on the first electrode in the pixel region, a second electrode on the organic light-emitting layer in the pixel region and electrically connected to the driving element, a third substrate attached to an outer surface of the second substrate, and a coloring element on an inner surface of the third substrate.

In another aspect, a method of fabricating an organic electroluminescent display device includes forming gate and data lines on a first substrate, the gate and data lines crossing each other to define a pixel region, forming a switching element at a crossing point of the gate and data lines, forming a driving element connected to the switching element, forming a first electrode on a first surface of a second substrate, forming an organic light-emitting layer on the first electrode in the pixel region, forming a second electrode on the organic light-emitting layer in the pixel region, the second electrode being electrically connected to the driving element, forming a coloring element on a third substrate, attaching the first substrate and the second substrate such that the second electrode faces and is electrically connected to the driving element, and attaching the third substrate to a second surface of the second substrate such that the coloring element is disposed between the third substrate and the second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Reference will now be made in detail to the illustrated embodiments of the present invention, examples of which are illustrated in the accompanying drawings.

Figure 3:
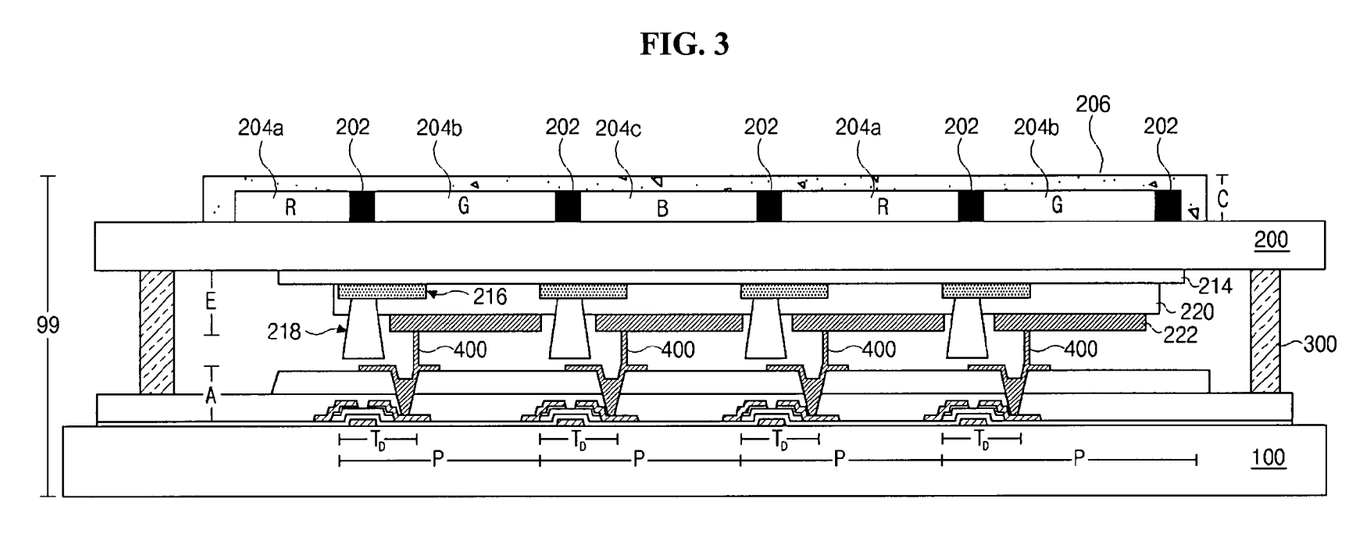
FIG. 3 is a schematic cross-sectional view of an organic electroluminescent display device according to a first embodiment of the present invention.

FIG. 3 is a schematic cross-sectional view of an organic electroluminescent display (OELD) device according to a first embodiment of the present invention. The OELD device of the first embodiment has a dual plate structure, in which a first substrate including a switching element and a second substrate including an electroluminescent diode are attached. The OELD device of the first embodiment also includes an additional color displaying element on the outside of the second substrate.

As shown in FIG. 3, the OELD device 99 of the first embodiment includes a first substrate 100 and a second substrate 200 that are spaced apart from and face each other. A sealant 300 is formed between the first and second substrates 100 and 200 to bond the first and second substrates 100 and 200 together. An array part A including a plurality of thin film transistors $T_D$ is formed on an inner surface of the first substrate 100. An emission part E is formed on an inner surface of the second substrate 200 (i.e., a surface facing the first substrate 100), and a color part C is formed on an outer surface of the second substrate 200 (i.e., a surface opposite to the inner surface of the second substrate 200).

In FIG. 3, the thin film transistor $T_D$ functions as a driving element of the OELD device. Although not shown, a switching element, a gate line, a data line, and a power line are typically formed on the inner surface of the first substrate 100. The switching element (not shown) and the driving element $T_D$ are formed in each pixel region P.

A first electrode 214 is formed on the inner surface of the second substrate 200 facing the first substrate 100. The first electrode 214 may include transparent conductive material or materials, and may function as an anode electrode for injecting holes into an organic light-emitting layer to be formed thereon. A plurality of organic light-emitting layers 220 is formed on the first electrode 214, and a plurality of second electrodes 222 is formed on the organic light-emitting layer 220. The second electrodes 222 may function as a cathode electrode for injecting electrons into the organic light-emitting layer 220.

A partition wall 218 is formed over the first electrode 214 in each border portion between adjacent pixel regions P. The organic light-emitting layers 220 may be patterned due to the partition wall 218 at the moment the organic light-emitting layers 220 are deposited.

An isolation pattern 216 may be formed between the partition wall 218 and the first electrode 214 to ensure that the second electrode 222 does not contact the first electrode 214.

The second electrodes 222 are independently patterned in each pixel region P, and the second electrode 222 is electrically connected to the corresponding driving element $T_D$ through a connection electrode 400.

The color part C, which is formed on the outer surface of the second substrate 200, includes coloring elements 204a, 204b and 204c and a passivation layer 206, which may be referred to as an overcoat layer, protecting the coloring elements 204a, 204b and 204c.

More particularly, a black matrix 202 is formed on the outer surface of the second substrate 200 to correspond to the border portion between the adjacent pixel regions P, and the coloring elements 204a, 204b and 204c are formed such that each coloring element 204a, 204b and 240c corresponds to one pixel region P. The passivation layer 206 is formed on an entire surface of the second substrate 200 including the black matrix 202 and the coloring elements 204a, 204b and 204c.

The coloring elements 204a, 204b and 204c may be a single layer of a color filter layer or a color-changing medium layer, or a double layer of the color filter layer and the color-changing medium layer.

In the case that the coloring elements 204a, 204b and 204c include the color-changing medium layer, the organic light-emitting layers 220 may emit blue light, for example. Thus, the blue light emitted from the organic light-emitting layer 220 is absorbed into the color-changing medium layer, and then the color-changing medium layer emits one of red, green and blue lights, depending upon the property of the color-changing medium layer. The color-changing medium layer is patterned to correspond to one pixel region because the color-changing medium layer is formed of different materials for emitting the red, green and blue lights, respectively.

The connection electrode 400 between the second electrode 222 and the driving element $T_D$ has a predetermined thickness in accordance with a gap between the first and second substrates 100 and 200.

FIGS. 4A to 4D are cross-sectional views illustrating a manufacturing method of an OELD device according to an embodiment of the present invention. FIGS. 4A to 4D show a substrate including an organic electroluminescent diode for the OELD device.

Figure 4A:
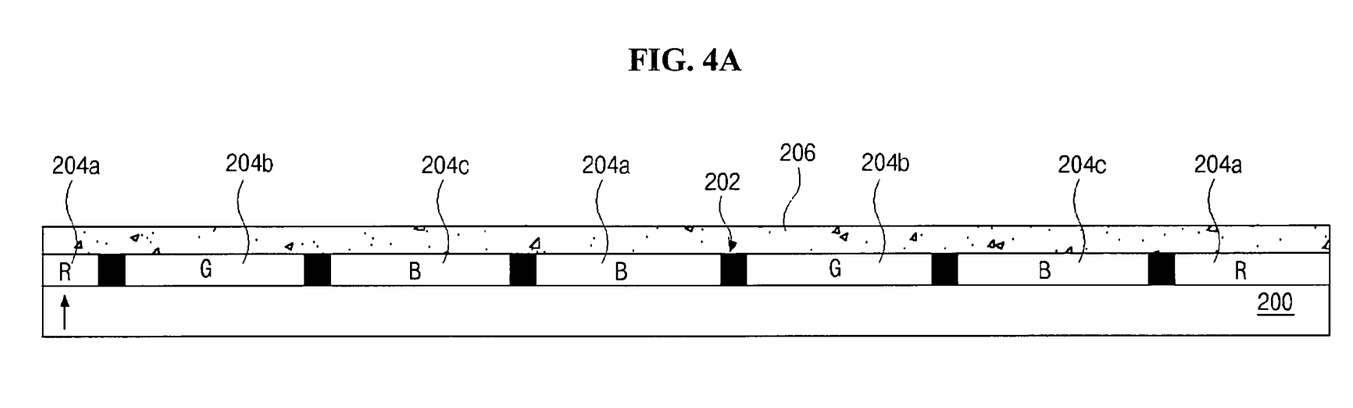
FIGS. 4A to 4D are cross-sectional views illustrating a manufacturing method of an organic electroluminescent display device according to an embodiment of the present invention.

In FIG. 4A, a black matrix 202 is formed on a first surface of a substrate 200 using a black resin or a metal material such as chromium (Cr) to define a plurality of pixel regions. The black matrix 202 corresponds to each border portion between adjacent pixel regions.

Next, coloring elements 204a, 204b and 204c are formed on the first surface of the substrate 200 corresponding to the pixel regions. The coloring elements 204a, 204b and 204c are disposed within the black matrix 202. The coloring elements 204a, 204b and 204c may be a single layer of a color filter layer or a color-changing medium layer, or a double layer of the color filter layer and the color-changing medium layer. Each coloring element 204a, 204b and 204c corresponds to one pixel region. Red, green and blue lights are transmitted through the coloring elements 204a, 204b and 204c, respectively.

A passivation layer 206 is formed on an entire first surface of the substrate 200 including the coloring elements 204a, 204b and 204c. The passivation layer 206 is formed of, for example, a transparent organic material such as benzocyclobutene (BCB), polyacrylate, polyimide, or polyamide.

Figure 4B:
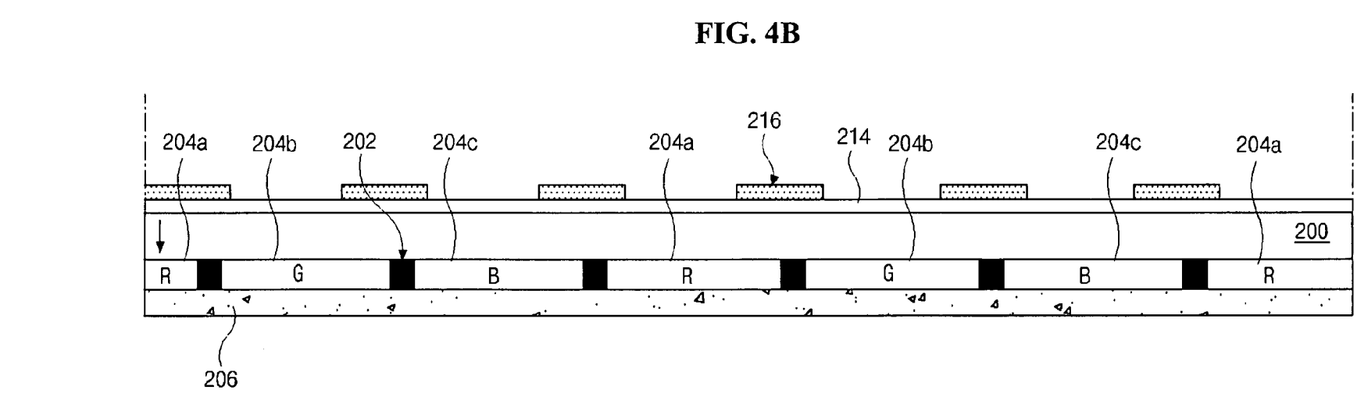

In FIG. 4B, a first electrode 214 is formed on a second surface of the substrate 200 opposite to the surface having the coloring elements 204a, 204b and 204c. The first electrode 214 functions as an anode for injecting holes into an organic light-emitting layer to be formed later. The first electrode 214 may be formed of indium tin oxide (ITO) that is transparent and has a high work function.

Next, isolation patterns 216 are formed on the first electrode 214 in the border portions between the adjacent pixel regions by depositing, for example, an inorganic insulating material, such as silicon nitride ($SiN_x$) or silicon oxide ($SiO_2$), and then patterning the inorganic insulating material. The isolation patterns 216 prevent the first electrode 214 from electrically shorting with second electrodes to be formed later.

Figure 4C:
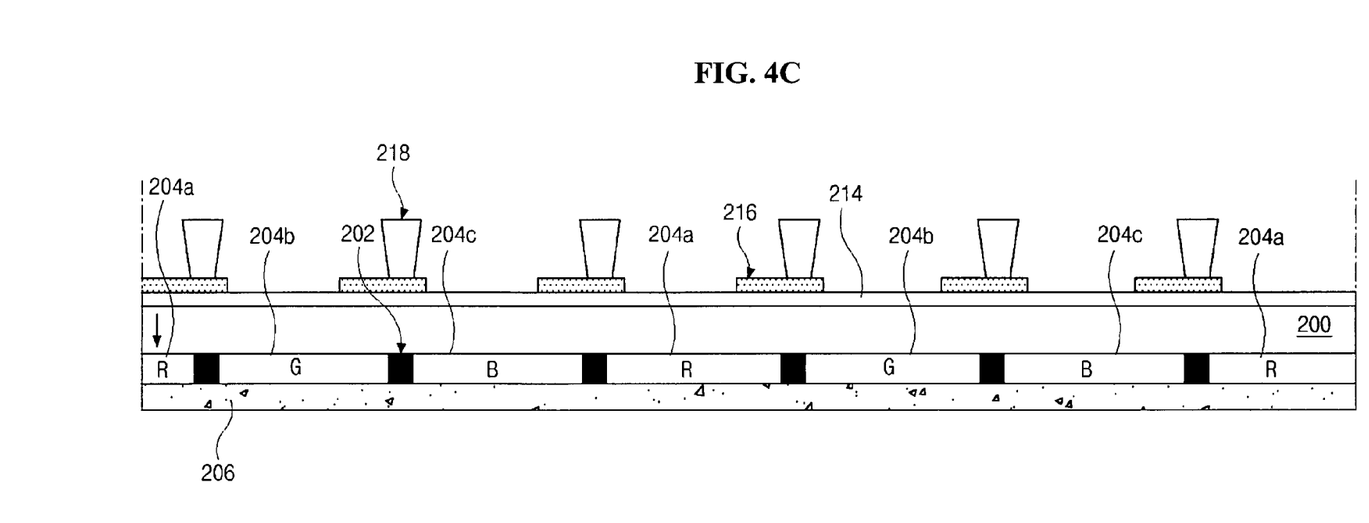

In FIG. 4C, partition walls 218 are formed on the isolation patterns 216 by coating a photosensitive organic material on an entire surface of the substrate 200 including the isolation patterns 216 and then pattering the photosensitive organic material. The partition walls 218 are disposed in the border portions between the adjacent pixel regions.

Figure 4D:
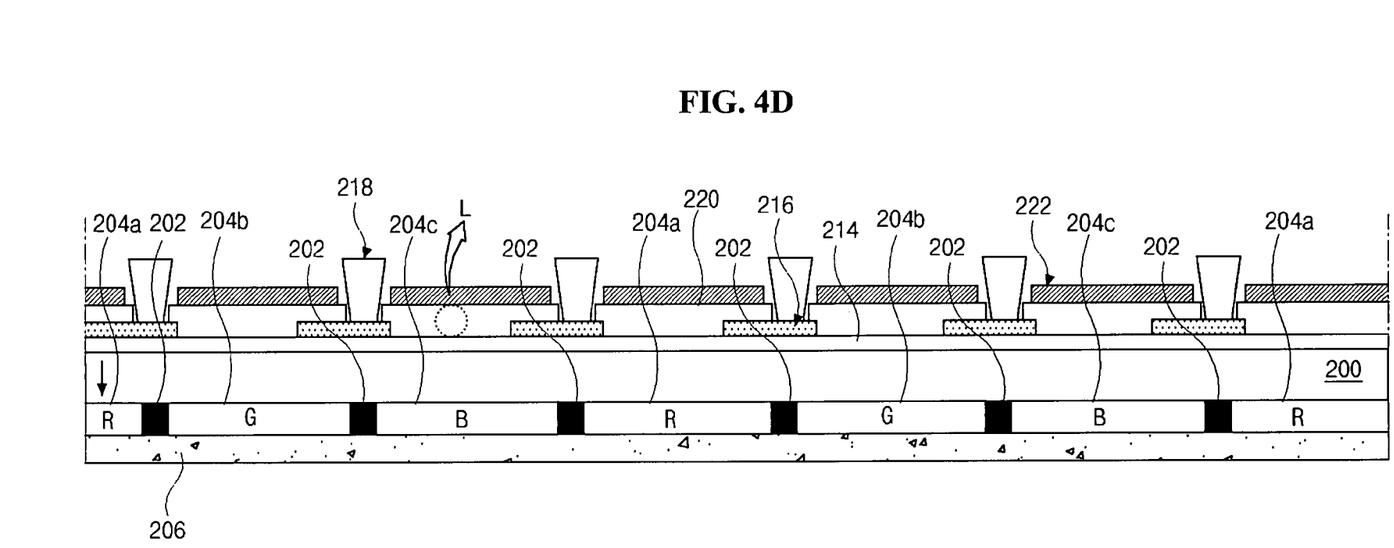

In FIG. 4D, organic light-emitting layers 220 are formed on the first electrode 214 between adjacent partition walls 218. Each organic light-emitting layer 220 corresponds to one pixel region. The organic light-emitting layer 220 in different pixel regions emits red, green and blue lights, respectively. Next, second electrodes 222 are formed on the organic light-emitting layers 220 by depositing a conductive material that has relatively a low work function on an entire surface of the substrate 200 including the organic light-emitting layers 220 and then patterning the conductive material. The second electrodes 222 may be a single layer including one of aluminum (Al), calcium (Ca) and magnesium (Mg) or may be a double layer including lithium-fluorine/aluminum(LiF/Al), for example.

Figure 5:
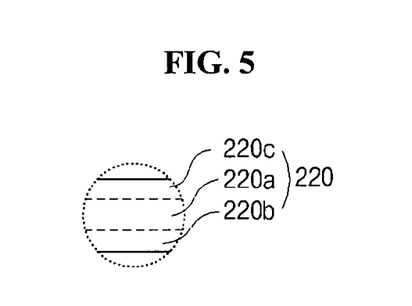
FIG. 5 is a view enlarging the portion L of FIG. 4D.

The organic light-emitting layer 220 may be formed in a single layer or in a multiple layer. In the multiple layer, as shown in FIG. 5, the organic light-emitting layer 220 may include an emissive layer 220a, a hole transporting layer 220b and an electron transporting layer 220c. FIG. 5 is a view enlarging the portion L of FIG. 4D. Here, the emissive layer 220a is disposed between the hole transporting layer 220b and the electron transporting layer 220c. The hole transporting layer 220b contacts the first electrode 214 and the electron transporting layer 220c contacts the second electrode 222.

The second electrodes 222 may be patterned in each pixel region due to the partition walls 218, each of which has reversely tapered sides, at the moment the second electrodes 222 are deposited. On the other hand, the second electrodes 222 may be patterned in each pixel region using a shadow mask without use of the partition walls 218.

In the present embodiment, if the passivation layer 206 is not durable against scratch, the passivation layer 206 may be damaged when the substrate 200 including the passivation layer 206 is turned upside down and the organic electroluminescent diode is formed. Thus, to protect the passivation layer 206, an additional insulating layer may be formed on the passivation layer 206, as described below.

Figure 6:
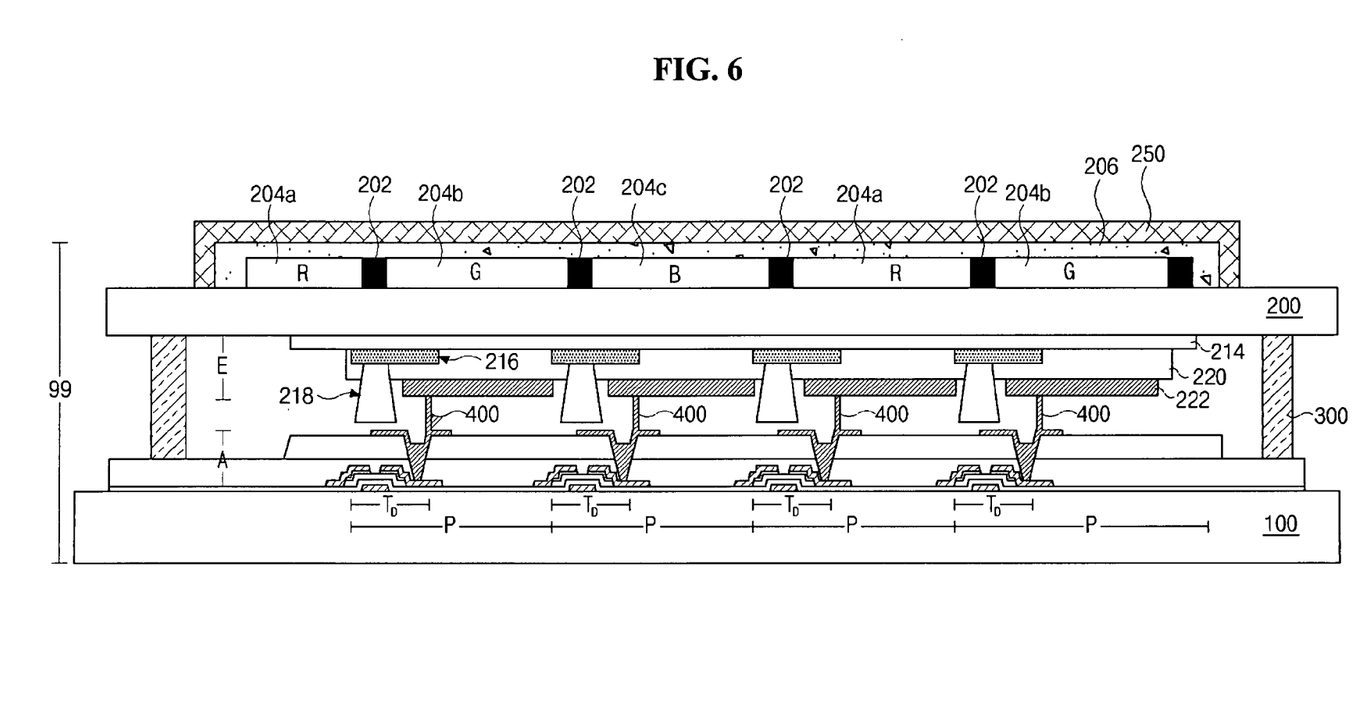
FIG. 6 is a schematic cross-sectional view of an organic electroluminescent display device according to a second embodiment of the present invention.

FIG. 6 is a schematic cross-sectional view of an organic electroluminescent display (OELD) device according to a second embodiment of the present invention. The OELD device of the second embodiment further includes an insulating layer on a passivation layer.

As shown in FIG. 6, the OELD device 99 of the second embodiment may include a first substrate 100 and a second substrate 200 that are spaced apart from and face each other. A sealant 300 is formed between the first and second substrates 100 and 200 to bond the first and second substrates 100 and 200 together. An array part A including a plurality of thin film transistors $T_D$ is formed on an inner surface of the first substrate 100. An emission part E is formed on an inner surface of the second substrate 200 (i.e., a surface facing the first substrate 100), and a color displaying element is formed on an outer surface of the second substrate 200 (i.e., a surface opposite to the inner surface of the second substrate 200).

In FIG. 6, the thin film transistor $T_D$ functions as a driving element of the OELD device. Although not shown, a switching element, a gate line, a data line, and a power line are typically formed on the inner surface of the first substrate 100. The switching element (not shown) and the driving element $T_D$ are formed in each pixel region P.

A first electrode 214 is formed on the inner surface of the second substrate 200 facing the first substrate 100. The first electrode 214 may include transparent conductive material or materials, and may function as an anode electrode for injecting holes into an organic light-emitting layer to be formed thereon. A plurality of organic light-emitting layers 220 is formed on the first electrode 214, and a plurality of second electrodes 222 is formed on the organic light-emitting layer 220. The second electrodes 222 may function as a cathode electrode for injecting electrons into the organic light-emitting layer 220.

A partition wall 218 is formed over the first electrode 214 in each border portion between adjacent pixel regions P. The organic light-emitting layers 220 may be patterned due to the partition wall 218 at the moment the organic light-emitting layers 220 are deposited. An isolation pattern 216 may be formed between the partition wall 218 and the first electrode 214 to ensure that the second electrode 222 does not contact the first electrode 214. The second electrodes 222 are independently patterned in each pixel region P, and the second electrode 222 is electrically connected to the corresponding driving element $T_D$ through a connection electrode 400.

Coloring elements 204a, 204b and 204c and a passivation layer 206, which may be referred to as an overcoat layer, for protecting the coloring elements 204a, 204b and 204c are formed on the outer surface of the second substrate 200. More particularly, a black matrix 202 is formed on the outer surface of the second substrate 200 to correspond to the border portion between the adjacent pixel regions P, and the coloring elements 204a, 204b and 204c are formed such that each coloring element 204a, 204b and 240c corresponds to one pixel region P. The passivation layer 206 is formed on an entire surface of the second substrate 200 including the black matrix 202 and the coloring elements 204a, 204b and 204c.

A transparent insulating layer 250 is formed on the passivation layer 206. The insulating layer 250 may be removed after completion of processes that may likely damage the outer surface of the second substrate. If the insulating layer 250 is removed at a subsequent process, the insulating layer 250 may be formed of an opaque material. In addition, a surface of the insulating layer 250 may be scratched or damaged. However, if the insulating layer 250 is to remain in the final product, the insulating layer 250 should be transparent and must not be scratched or damaged.

The coloring elements 204a, 204b and 204c may be a single layer of a color filter layer or a color-changing medium layer, or a double layer of the color filter layer and the color-changing medium layer.

In the case that the coloring elements 204a, 204b and 204c include the color-changing medium layer, the organic light-emitting layers 220 may emit blue light, for example. Thus, the blue light emitted from the organic light-emitting layer 220 is absorbed into the color-changing medium layer, and then the color-changing medium layer emits one of red, green and blue lights, depending upon the property of the color-changing medium layer. The color-changing medium layer is patterned to correspond to one pixel region because the color-changing medium layer is formed of different materials for emitting the red, green and blue lights, respectively.

The connection electrode 400 between the second electrode 222 and the driving element $T_D$ has a predetermined thickness in accordance with a gap between the first and second substrates 100 and 200.

Figure 7:
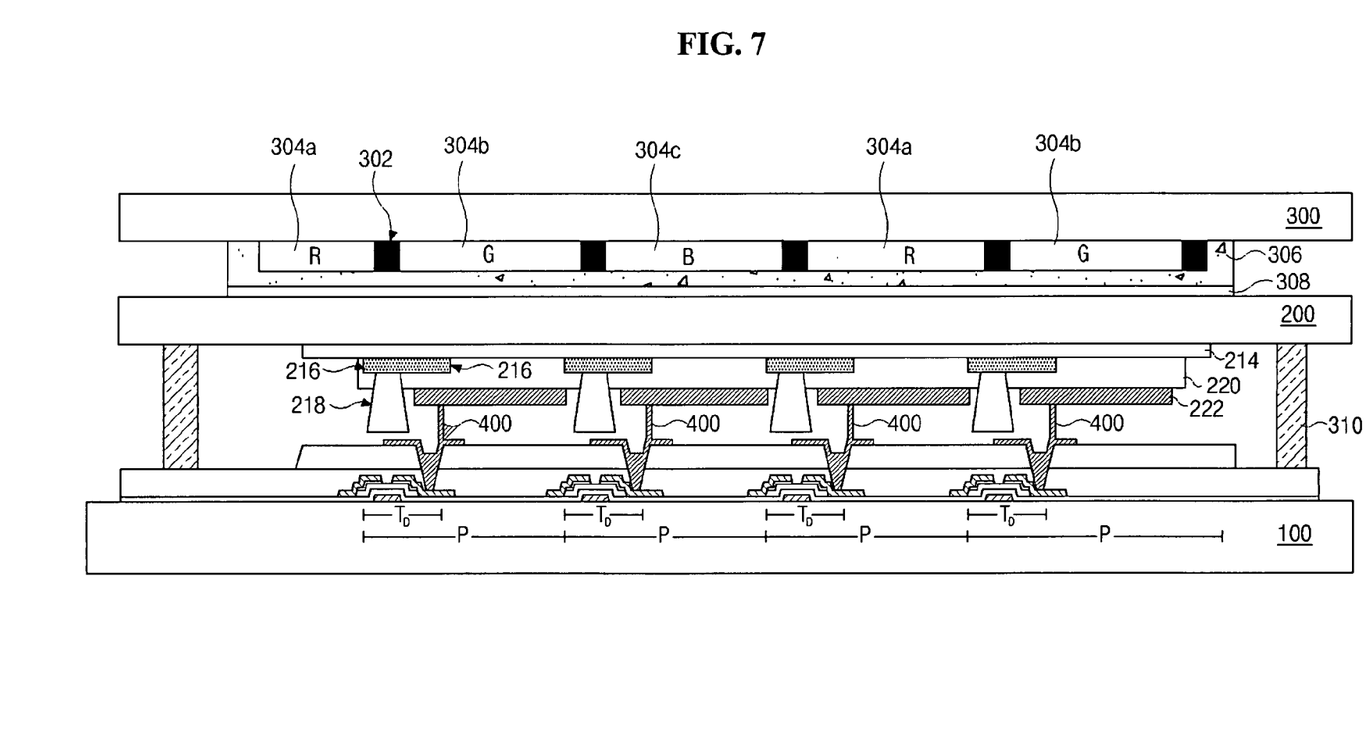
FIG. 7 is a schematic cross-sectional view of an organic electroluminescent display device according to a third embodiment of the present invention.

FIG. 7 is a schematic cross-sectional view of an organic electroluminescent display device according to a third embodiment of the present invention. In the OELD device of the third embodiment, a substrate having a color displaying element thereon is attached to a dual plate structure OELD device.

As shown in FIG. 7, the OELD device of the third embodiment includes a first substrate 100 having an array part that includes a plurality of thin film transistors $T_D$ thereon, a second substrate 200 having an emission part on a surface facing the first substrate 100, and a third substrate 300 having a color displaying element.

A sealant 310 is formed between the first and second substrates 100 and 200 to bond the first and second substrates 100 and 200 together. The third substrate 300 including coloring elements 304a, 304b and 304c is attached to an outer surface of the second substrate 200 using an adhesion layer 308, which is formed on an entire surface of the third substrate 300.

In FIG. 7, the thin film transistor $T_D$ functions as a driving element of the OELD device. Although not shown, a switching element, a gate line, a data line, and a power line are also typically formed on the inner surface of the first substrate 100. The switching element (not shown) and the driving element $T_D$ are formed in each pixel region P.

A first electrode 214 is formed on an inner surface of the second substrate 200 facing the first substrate 100. The first electrode 214 may include transparent conductive material or materials, and may function as an anode electrode for injecting holes into an organic light-emitting layer to be formed thereon. A plurality of organic light-emitting layers 220 are formed on the first electrode 214, and a plurality of second electrodes 222 are formed on the organic light-emitting layer 220. The second electrodes 222 may function as a cathode electrode for injecting electrons into the organic light-emitting layer 220.

A partition wall 218 is formed over the first electrode 214 in each border portion between adjacent pixel regions P. The organic light-emitting layers 220 may be independently patterned due to the partition wall 218 at the moment the organic light-emitting layers 220 are deposited. An isolation pattern 216 may be formed between the partition wall 218 and the first electrode 214 to ensure that the second electrode 222 does not contact the first electrode 214. The second electrodes 222 are independently patterned in each pixel region P, and the second electrode 222 is electrically connected to the corresponding driving element $T_D$ through a connection electrode 400.

A black matrix 302 is formed on a surface of the third substrate 300, which faces the outer surface of the second substrate 200, to correspond to the border portion between the adjacent pixel regions P. The coloring elements 304a, 204b and 204c are formed on the surface of the third substrate 300 such that each coloring element 304a, 304b and 340c corresponds to one pixel region P. A passivation layer 306 is formed on an entire surface of the third substrate 300 including the black matrix 302 and the coloring elements 304a, 304b and 304c.

The coloring elements 304a, 304b and 304c may be a single layer of a color filter layer or a color-changing medium layer, or a double layer of the color filter layer and the color-changing medium layer.

In the case that the coloring elements 304a, 304b and 304c include the color-changing medium layer, the organic light-emitting layers 220 may emit blue light, for example. Thus, the blue light emitted from the organic light-emitting layer 220 is absorbed into the color-changing medium layer, and then the color-changing medium layer emits one of red, green and blue lights, depending upon the property of the color-changing medium layer. The color-changing medium layer is patterned to correspond to one pixel region because the color-changing medium layer is formed of different materials for emitting the red, green and blue lights, respectively.

The connection electrode 400 between the second electrode 222 and the driving element $T_D$ has a predetermined thickness in accordance with a gap between the first and second substrates 100 and 200.

A process of forming the coloring elements 304a, 304b and 304c is the same as the process illustrated in FIG. 4A.

Figure 8:
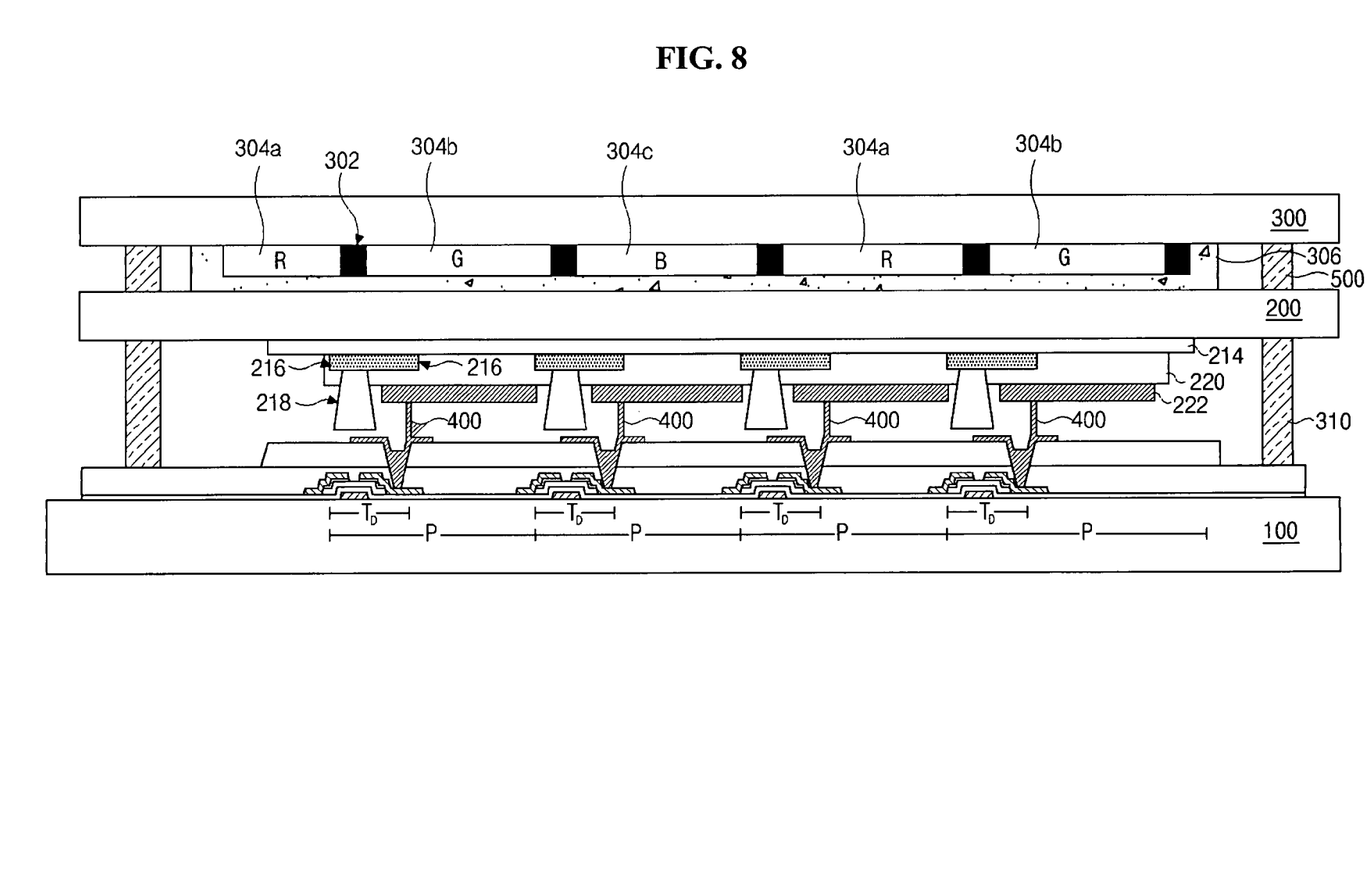
FIG. 8 is a schematic cross-sectional view of an organic electroluminescent display device according to a fourth embodiment of the present invention.

FIG. 8 is a schematic cross-sectional view of an organic electroluminescent display device according to a fourth embodiment of the present invention. In the OELD device of the fourth embodiment, a substrate having a color displaying element thereon is attached to a dual plate structure OELD device using a seal pattern.

As shown in FIG. 8, the OELD device of the fourth embodiment includes a first substrate 100 having an array part that includes a plurality of thin film transistors $T_D$ thereon, a second substrate 200 having an emission part on a surface facing the first substrate 100, and a third substrate 300 having a color displaying element.

A first seal pattern 310 is formed between the first and second substrates 100 and 200 in a peripheral portion to bond the first and second substrates 100 and 200 together. A second seal pattern 500 having a line shape is formed between the second substrate 200 and the third substrate 300 in the peripheral portion to bond the second and third substrates 200 and 300.

In FIG. 8, the thin film transistor $T_D$ functions as a driving element of the OELD device. Although not shown, a switching element, a gate line, a data line, and a power line are also typically formed on the inner surface of the first substrate 100. The switching element (not shown) and the driving element $T_D$ are formed in each pixel region P.

A first electrode 214 is formed on an inner surface of the second substrate 200, which faces the first substrate 100. The first electrode 214 may include transparent conductive material or materials, and may function as an anode electrode for injecting holes into an organic light-emitting layer to be formed thereon. A plurality of organic light-emitting layers 220 are formed on the first electrode 214, and a plurality of second electrodes 222 are formed on the organic light-emitting layer 220. The second electrodes 222 may function as a cathode electrode for injecting electrons into the organic light-emitting layer 220.

A partition wall 218 is formed over the first electrode 214 in each border portion between adjacent pixel regions P. The organic light-emitting layers 220 may be independently patterned due to the partition wall 218 at the moment the organic light-emitting layers 220 are deposited. An isolation pattern 216 may be formed between the partition wall 218 and the first electrode 214 to ensure that the second electrode 222 does not contact the first electrode 214. The second electrodes 222 are independently patterned in each pixel region P, and the second electrode 222 is electrically connected to the corresponding driving element $T_D$ through a connection electrode 400.

A black matrix 302 is formed on a surface of the third substrate 300, which faces an outer surface of the second substrate 200, to correspond to the border portion between the adjacent pixel regions P, and the coloring elements 304a, 204b and 204c are formed on the surface of the third substrate 300 such that each coloring element 304a, 304b and 340c corresponds to one pixel region P. A passivation layer 306 is formed on an entire surface of the third substrate 300 including the black matrix 302 and the coloring elements 304a, 304b and 304c.

The coloring elements 304a, 304b and 304c may be a single layer of a color filter layer or a color-changing medium layer, or a double layer of the color filter layer and the color-changing medium layer.

In the case that the coloring elements 304a, 304b and 304c include the color-changing medium layer, the organic light-emitting layers 220 may emit blue light, for example. Thus, the blue light emitted from the organic light-emitting layer 220 is absorbed into the color-changing medium layer, and then the color-changing medium layer emits one of red, green and blue lights, depending on the property of the color-changing medium layer. The color-changing medium layer is patterned to correspond to one pixel region because the color-changing medium layer is formed of different materials for emitting the red, green and blue lights, respectively.

The connection electrode 400 between the second electrode 222 and the driving element $T_D$ has a predetermined thickness in accordance with a gap between the first and second substrates 100 and 200.

Figure 9:
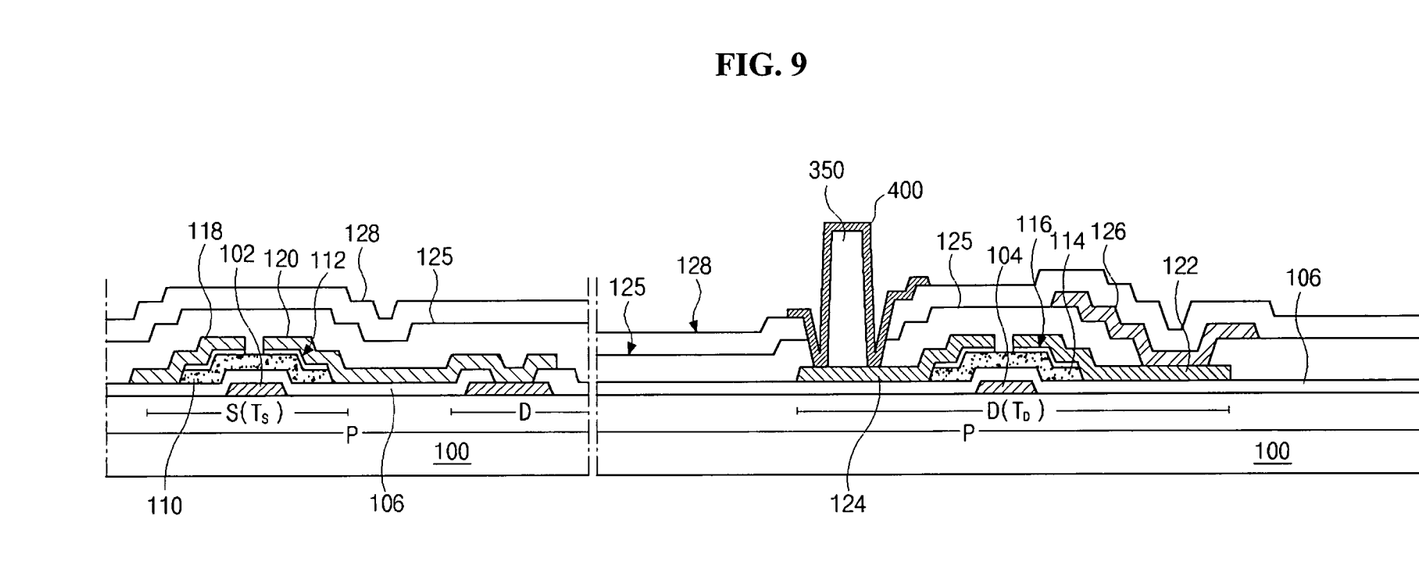
FIG. 9 is a cross-sectional view of an array substrate for an organic electroluminescent display device according to an embodiment of the present invention.

FIG. 9 is a cross-sectional view of an array substrate for an organic electroluminescent display device according to an embodiment of the present invention, and shows one pixel. The array substrate of FIG. 9 may be used as the lower substrate of the OELD device in the first to fourth embodiments.

In FIG. 9, a pixel region P is defined on a substrate 100, and the pixel region P includes a switching area S and a driving area D.

First and second gate electrodes 102 and 104 are formed in the switching area S and the driving area D, respectively, on a substrate 100, and a gate insulating layer 106 is formed on an entire surface of the substrate 100 including the first and second gate electrodes 102 and 104.

First and second active layers 110 and 114 and first and second ohmic contact layers 112 and 116 are sequentially formed on the gate insulating layer 106. The first active layer 110 and the first ohmic contact layer 112 are disposed over the first gate electrode 102, and the second active layer 114 and the second ohmic contact layer 116 are disposed over the second gate electrode 104.

First source and drain electrodes 118 and 120 and second source and drain electrodes 122 and 124 are formed on the first ohmic contact layer 112 and the second ohmic contact layer 116, respectively, by depositing a metal material on an entire surface of the substrate 100 including the first and second ohmic contact layers 112 and 116 and then patterning the metal material. The first source and drain electrodes 118 and 120 are spaced apart from each other over the first ohmic contact layer 112 in the switching area S, and the second source and drain electrodes 120 and 124 are spaced apart from each other over the second ohmic contact layer 116 in the driving area D.

The first drain electrode 120 of the switching area S is connected to the second electrode 104 of the driving area D. Thus, a switching element $T_S$ and a driving element $T_D$ are formed in the switching area S and the driving area D, respectively. The switching element $T_S$ includes the first gate electrode 102, the first active layer 110, the first ohmic contact layer 112, the first source electrode 118 and the first drain electrode 120. The driving element $T_D$ includes the second gate electrode 104, the second active layer 114, the second ohmic contact layer 116, the second source electrode 122 and the second drain electrode 124.

A first passivation layer 125 is formed on an entire surface of the substrate 100 including the switching element $T_S$ and the driving element $T_D$. The first passivation layer 125 is patterned to expose the second source electrode 122. The first passivation layer 125 may be formed of an inorganic insulating material.

A power line 126 is formed on the first passivation layer 125. The power line 126 is connected to the second source electrode 122 of the driving element $T_D$ exposed by the first passivation layer 125.

A second passivation layer 128 is formed on an entire surface of the substrate 100 including the power line 126. The second passivation layer 128 is patterned to expose the second drain electrode 124 of the driving element $T_D$.

Next, a connection electrode 400 is formed on the second passivation layer 128. The connection electrode 400 will be connected to a second electrode formed on another substrate. The connection electrode 400 is connected to the second drain electrode 124 of the driving element $T_D$. The connection electrode 400 should have an appropriate height in accordance with a gap between two substrates for the OELD device. Thus, for example, an organic pattern 350 having a predetermined thickness is formed under the connection electrode 400.

In the embodiments of the present invention, the thin film transistor is formed on the first substrate and the organic layer is formed on the second substrate. Furthermore, since the first electrode is disposed over the second electrode and is transparent, the OELD is a top emission mode. In addition, coloring elements including a color filter layer or a color-changing medium layer are formed on or over the outer surface of the second substrate. Therefore, the present invention can provide an OELD and a method of fabricating the same having a high aperture ratio and can improve the yield and productivity. Additionally, the OELD and a method of fabricating the same are reliable, and the lifetime of the OELD device is increased.

It will be apparent to those skilled in the art that various modifications and variations can be made in the organic electroluminescent display device and the method of fabricating the same of the present invention without departing from the spirit or scope of the inventions. Thus, it is intended that the present invention covers the modifications and variations of this invention provided they come within the scope of the appended claims and their equivalents.

What is claimed is:

1. An organic electroluminescent display device, comprising:
   first and second substrates facing and spaced apart from each other;
   gate and data lines on an inner surface of the first substrate and crossing each other to define a pixel region;
   a switching element at a crossing point of the gate and data lines;
   a driving element connected to the switching element;
   a first passivation layer including a contact hole exposing a drain electrode of the driving element;
   a first electrode on an inner surface of the second substrate;
   an organic light-emitting layer on the first electrode in the pixel region;
   a partition wall formed in a border portion between adjacent pixel regions such that the organic light-emitting layer is partitioned by the partition wall;
   a second electrode on the organic light-emitting layer in the pixel region;
   an organic pattern being formed only on a drain electrode of the driving element;

a connection electrode covering the organic pattern and electrically connecting with the second electrode of the second substrate as well as with the drain electrode of the driving element through the contact hole;

an isolation pattern formed between the partition wall and the first electrode to prevent the second electrode from contacting the first electrode;

a third substrate attached to an outer surface of the second substrate;

a coloring element on an inner surface of the third substrate; and a black matrix on the inner surface of the third substrate, wherein the black matrix corresponds to the partition wall.

2. The device according to claim 1, further comprising a power line connected to the driving element.

3. The device according to claim 1, wherein the first electrode functions as an anode electrode and the second electrode acts as a cathode electrode.

4. The device according to claim 1, wherein the coloring element includes a color filter layer.

5. The device according to claim 1, wherein the coloring element includes a color-changing medium layer.

6. The device according to claim 5, wherein the coloring element further includes a color filter layer.

7. The device according to claim 5, wherein the organic light-emitting layer emits blue light.

8. The device according to claim 1, further comprising a second passivation layer covering the coloring element and the black matrix at the inner surface of the third substrate.

9. The device according to claim 1, wherein the first and second substrates are attached by a seal pattern, and the second and third substrates are attached by an adhesion layer that is applied to an entire inner surface of the third substrate.

10. The device according to claim 1, wherein the first and second substrates are attached by a first seal pattern in a peripheral portion and the second and third substrates are attached by a second seal pattern in a peripheral portion.

11. A method of fabricating an organic electroluminescent display device, comprising:

forming gate and data lines on a first substrate, the gate and data lines crossing each other to define a pixel region;

forming a switching element at a crossing point of the gate and data lines;

forming a driving element connected to the switching element;

forming a first passivation layer including a contact hole to expose a drain electrode of the driving element;

forming an organic pattern only on the drain electrode of the driving element with a predetermined thickness in accordance with a gap between the first and the second substrates;

forming a connection electrode on to cover the organic pattern for connecting the drain electrode of the driving element with a second electrode of the second substrate electrically;

forming a first electrode on a first surface of a second substrate;

forming an organic light-emitting layer on the first electrode in the pixel region;

forming an isolation pattern between the partition wall and the first electrode to prevent the second electrode from contacting the first electrode;

forming a partition wall in a border portion between adjacent pixel regions such that the organic light-emitting layer is partitioned by the partition wall;

forming a second electrode on the organic light-emitting layer in the pixel region, the second electrode being electrically connected to the driving element;

forming a coloring element on a third substrate;

attaching the first substrate and the second substrate such that the second electrode faces and is electrically connected to the connection electrode; and attaching the third substrate to a second surface of the second substrate such that the coloring element is disposed between the third substrate and the second substrate, and forming a black matrix on a surface of the third substrate that has the color element thereon, wherein the black matrix corresponds to the partition wall.

12. The method according to claim 11, wherein the first electrode functions as an anode electrode and the second electrode acts as a cathode electrode.

13. The method according to claim 12, wherein the first electrode has a higher work function than the second electrode.

14. The method according to claim 13, wherein the first electrode includes indium tin oxide, and the second electrode includes one of aluminum (Al), calcium (Ca), magnesium (Mg) and lithium-fluorine/aluminum(LiF/Al).

15. The method according to claim 11, wherein the coloring element includes a color filter layer.

16. The method according to claim 11, wherein the coloring element includes a color-changing medium layer.

17. The method according to claim 16, wherein the coloring element further includes a color filter layer.

18. The method according to claim 16, wherein the organic light-emitting layer emits blue light.

19. The method according to claim 11, further comprising forming a power line connected to the driving element.

20. The method according to claim 11, further comprising forming a second passivation layer covering the coloring element and the black matrix over the third substrate.

21. The method according to claim 11, wherein attaching the first substrate and the second substrate includes forming a seal pattern at a periphery portion, and wherein attaching third substrate to the second surface of the second substrate includes forming an adhesion layer between substantially the entire second surface of the second substrate and substantially an entire surface of the third substrate that has the coloring element thereon.

22. The method according to claim 11, wherein attaching the first substrate and the second substrate includes forming a first seal pattern in a peripheral portion, and wherein attaching the third substrate to the second surface of the second substrate includes forming a second seal pattern in a peripheral portion.

* * * * *